United States Patent [19]

Matsumoto et al.

[11] Patent Number: 4,999,228

[45] Date of Patent: Mar. 12, 1991

[54] SILICON CARBIDE DIFFUSION TUBE FOR SEMI-CONDUCTOR

[75] Inventors: Fukuji Matsumoto, Takefu; Yoshio Tawara, Fukui; Michio Hayashi, Takefu, all of Japan

[73] Assignee: Shin-Etsu Chemical Co., Ltd., Tokyo, Japan

[21] Appl. No.: 346,736

[22] Filed: May 3, 1989

[30] Foreign Application Priority Data

May 6, 1988 [JP] Japan ................................ 63-109211
May 6, 1988 [JP] Japan ................................ 63-109212

[51] Int. Cl.$^5$ ........................... F27D 5/00; B05D 3/14
[52] U.S. Cl. .................................... 428/34.4; 427/51; 427/237; 432/253; 432/258
[58] Field of Search ............... 432/253, 258; 428/34.4; 427/51, 237

[56] References Cited

U.S. PATENT DOCUMENTS

| | | | |
|---|---|---|---|
| 3,951,587 | 4/1976 | Alliegro et al. | 432/258 |
| 4,382,776 | 5/1986 | Kawase et al. | 432/258 |
| 4,459,104 | 7/1984 | Wollmann | 432/258 |
| 4,761,134 | 8/1988 | Foster | 432/258 |

Primary Examiner—James Seidleck
Attorney, Agent, or Firm—Birch, Stewart, Kolasch & Birch

[57] ABSTRACT

Disclosed is a silicon carbide type diffusion tube comprising a diffusion tube base made of reaction-sintered silicon carbide having an iron concentration of 20 ppm or below and a density of 3.0 g/cm$^3$ or over, and a silicon carbide layer consisting of a high-purity silicon carbide film having an iron concentration of 5 ppm or below deposited on the inner surface of the tube base and a silicon carbide type diffusion tube comprising a diffusion tube base made of reaction-sintered silicon carbide, and a silicon carbide layer consisting of a Si-depleted layer formed in the inner wall of the reaction-sintered silicon carbide tube base and a high-purity silicon carbide film deposited on the Si-depleted layer, said silicon carbide film having a thickness of more than 0.5 mm.

12 Claims, 1 Drawing Sheet

SILICON CARBIDE DIFFUSION TUBE FOR SEMI-CONDUCTOR

BACKGROUND OF THE INVENTION

1. Field of the Invention

The present invention relates to a diffusion tube particularly useful in a diffusion furnace in which a semiconductor is heat-treated. More particularly, the present invention relates to a silicon carbide type diffusion tube that will not allow silicon wafers to have defects as a result of the presence of impurities.

2. Discussion of Related Art

Conventional types of diffusion tubes useful in a semiconductor diffusion furnace, include a quartz diffusion tube or a silicon carbide type diffusion tube. When these diffusion tubes are used to heat-treat a semiconductor, impurities present in the diffusion tube cause the silicon wafer to have defects, considerably lowering the yield of the semiconductor in the heat-treatment step. With respect to the purity, since quartz is superior to silicon carbide, a quartz diffusion tube is generally used.

However, even quartz is not satisfactory enough with respect to purity. Further, quartz diffusion tubes are liable to deform at a high temperature. Therefore, a defect of such quartz diffusion tubes is that the useful life thereof is short. Particularly, when the treating temperature is over 1,200° C., the wear is severe due to the deformation, devitrification, etc., so that quartz diffusion tubes have to be replaced frequently. On the other hand, if the treating temperature is lowered in order to avoid the problems of deformation and devitrification of the quartz diffusion tubes, the treating time must be extended considerably, resulting in a high cost of production of the semiconductor.

In contrast, a silicon carbide type diffusion tube hardly deform even at a high temperature, and devitrification observed within a quartz diffusion tube will not take place in the case of a silicon carbide type diffusion tube. The usable period of a silicon carbide type diffusion tube can be extended considerably in comparison with a quartz diffusion tube. However, with respect to the purity, since a silicon carbide type diffusion tube in the prior art is inferior to a quartz diffusion tube, the application of a silicon carbide type diffusion tube is limited.

SUMMARY OF THE INVENTION

The object of present invention is to provide a silicon carbide type diffusion tube effective for a semiconductor diffusion furnace that does not have disadvantages such as deformation and devitrification even at a high temperature and does not allow a silicon wafer to have defects due to the presence of impurities.

The inventors have conducted intensive research to attain the above object of the invention. As a result, they have found that a diffusion tube should comprise a diffusion tube base made of reaction-sintered silicon carbide having a density of 3.0 g/cm$^3$ or over and an iron concentration of 20 ppm or below, and a silicon carbide layer consisting of a high-purity silicon carbide film having an iron concentration of 5 ppm or below deposited on the inner surface of the diffusion tube base. More specifically, the inventors have found that since the silicon carbide type diffusion tube in the prior art is only made of a composite material of SiC and Si and the diffusion coefficient of impurities at a high temperature is far higher in Si than in SiC, the impurities contaminate the inside wall of the diffusion tube mainly through the Si phase. When a high-purity silicon carbide film having an iron concentration of 5 ppm or below is deposited on the inner surface of the diffusion tube base, for example, by CVD (chemical vapor deposition) process according to the present invention, the diffusion of impurities into the inside layer of the diffusion tube from the diffusion tube base and the outside of the diffusion tube can be intercepted by the film. The diffusion tube in which the tube base is made of reaction-sintered silicon carbide having a density of 3.0 g/cm$^3$ or over and the silicon carbide film is deposited on the inner surface thereof according to the present invention neither deformsnor devitrifies even at a high temperature, is excellent in strength, can be used for a long period of time under high-temperature conditions, and therefore can be used as a diffusion tube suitable for a semiconductor diffusion furnace.

The inventors also have found that the diffusion of impurities from the diffusion tube base and from the outside into the inside layer of the diffusion tube can be more positively intercepted and a diffusion tube for a semiconductor diffusion furnace that is positively prevented from deforming or devitrifying even at a high temperature can be provided, when a diffusion tube comprises a diffusion tube base made of reaction-sintered silicon carbide and a silicon carbide layer consisting of a Si-depleted layer formed in the inner wall of the reaction-sintered silicon carbide tube base and a high-purity silicon carbide film deposited on the Si-depleted layer, and the silicon carbide layer has a thickness of more than 500 μm.

A technique of forming a silicon carbide film on the inner surface of a recrystallized silicon carbide type diffusion tube is known in Japanese Patent Publication No. 20128/1986, but the technique is intended to improve the corrosion resistance at the time when the diffusion tube is cleaned. In contrast, the inventors have found that by using reaction-sintered silicon carbide as a base material of a diffusion tube while controlling the iron concentration of the diffusion tube matrix to be 20 ppm or below and the density thereof to be 3.0 g/cm$^3$ or over and depositing a high-purity silicon carbide film having an iron concentration of 5 ppm or below on the inner surface of the diffusion tube base, the diffusion of impurities from the diffusion tube matrix and the outside can be effectively intercepted by the film, and the contamination of a silicon wafer due to the presence of impurities in the heat treatment step can be effectively prevented. Therefore the purpose of the present invention is quite different from that of the prior art.

The technique described in Japanese Patent Publication No. 20128/1986 mentioned above uses recrystallized silicon carbide as the base material. Since the strength of the recrystallized silicon carbide is poor (the bend strength of reaction-sintered silicon carbide is 35 to 45 kg/mm$^2$, whereas the bend strength of recrystallized silicon carbide is 15 to 25 kg/mm$^2$, which is about half of that of reaction-sintered silicon carbide), the recrystallized silicon carbide having the film deposited thereon will break, when used under high-temperature conditions, due to the thermal stress generated by a difference in the thermal expansion coefficient between the film deposited on the inner surface and the base material. Particularly, when it is repeatedly used over and over again, it will break very easily due to the thermal cycles. In contrast, since the tube base formed from the reaction-sintered silicon carbide having a density of 3.0 g/cm³ or over is high in strength, even when the silicon carbide film is formed on the inner surface of the diffusion tube base and the diffusion tube is used under high-temperature conditions or subjected to repeated thermal cycles, the diffusion tube according to the present invention will not break easily and can be used for a longer period of time. Thus, the present inventors have found that it can be used suitably for a semiconductor diffusion furnace.

Further, in Japanese Patent Publication No. 20128/1986, the thickness of the silicon carbide film is 500 μm or below. In the process of forming a silicon carbide film on a recrystallized silicon carbide type diffusion tube surface in the prior art, the film is formed on the porous recrystallized silicon carbide type diffusion tube surface, and then the outer surface is impregnated with Si. Since the recrystallized silicon carbide is poor in strength, if the thickness of the silicon carbide film is made to be more than 0.5 mm, the film will break due to the thermal cycles when used. According to the present invention, since reaction-sintered silicon carbide having a density of 3.0 g/cm³ or over used as the base material, the tube base is high in strength, and it has no problems if the thickness of the silicon carbide layer is made to be more than 0.5 mm or even to be 1 mm or over, thereby attaining a great effect on the interception of impurities. Thus, the reaction-sintered silicon carbide and the recrystallized silicone carbide are different in its method of production and properties.

Therefore, the present invention provides a silicon carbide type diffusion tube comprising a diffusion tube base made of reaction-sintered silicon carbide having an iron concentration of 20 ppm or below and a density of 3.0 g/cm³ or over, and a silicon carbide layer consisting of a high-purity silicon carbide film having an iron concentration of 5 ppm or below deposited on the whole inner surface of the diffusion tube base, and also provides a silicon carbide type diffusion tube comprising a diffusion tube base made of reaction-sintered silicon carbide, and a silicon carbide layer consisting of a Si-depleted layer formed in the inner wall of the reaction-sintered silicon carbide tube base and a high-purity silicon carbide film deposited on the Si-depleted layer, said silicon carbide layer having a thickness of more than 0.5 mm.

The above and other objects, features and advantages of the present invention will be more apparent from the following description.

PREFERRED EMBODIMENT OF THE INVENTION

Figure 1:
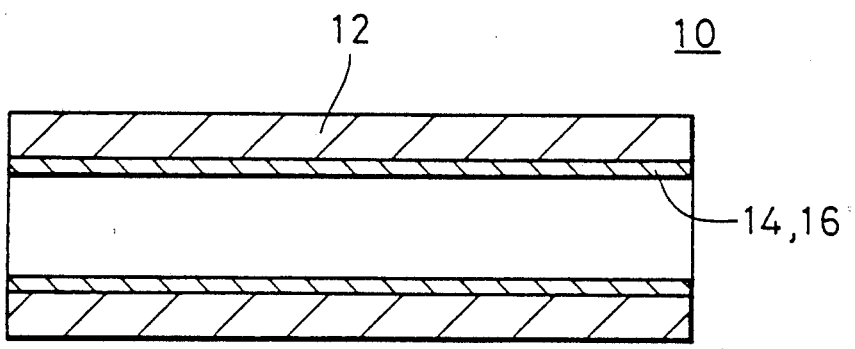
FIG. 1 is a sectional view showing one embodiment of a diffusion tube according to the present invention.

FIG. 1 shows a preferred embodiment of a diffusion tube 10 according to the present invention. The diffusion tube 10 comprises a diffusion tube base 12 made of reaction-sintered silicon carbide, and a silicon carbide layer 14 consisting of a high-purity silicon carbide film 16 deposited on the inner surface of the tube base 12.

Since the reaction tube 10 has a silicon carbide film 16 formed on the inner surface of the diffusion tube base 12, diffusion of impurities from the diffusion tube base and the outside of the diffusion tube is intercepted so that, when a semiconductor is heat-treated, the silicon wafer may be prevented from being contaminated with the impurities. In this case, if the purity of the silicon carbide film is poor, the silicon wafer will be contaminated with the impurities diffused from the silicon carbide film. Therefore, it is required to make the silicon carbide film highly pure, and particularly it is required to control the iron content of the film to be 5 ppm or below, preferably 1 ppm or below. Iron is a material that will most readily contaminate the diffusion tube in the production. By controlling the iron content to be 5 ppm or below, other detrimental impurities such as Ti, Cu, Mn, Mg, Ni, etc. can be controlled to be 5 ppm or below in total.

Preferably, the thickness of the silicon carbide film 16 is more than 50 μm, more preferably more than 200 μm, and most preferably more than 500 μm. The upper limit should be 2000 μm. If the thickness of the silicon carbide film is below 50 μm, the effect on interception of impurities may become insufficient, while if the thickness of the silicon carbide film is over 2,000 μm, the film may become apt to break when used.

The present diffusion tube comprises a reaction-sintered silicon carbide diffusion tube base having the above-mentioned silicon carbide film with an iron concentration of 5 ppm or below deposited on the inner surface thereof. In this case, the purity of the tube base is very important in order to keep the iron concentration of the silicon carbide film at 5 ppm or below. It is necessary to control the iron concentration of the tube base to 20 ppm or below, preferably 10 ppm or below, and most preferably 5 ppm or below. If the iron content in the tube base exceeds 20 ppm, it is impossible to keep the iron concentration in the silicon carbide film at 5 ppm or below, although the pure silicon carbide film having an iron concentration of 5 ppm or below is first formed.

The reaction-sintered silicon carbide is obtained, as shown in Japanese Patent Publication No. 38061/1970, by adding a large amount (about 15 to about 40% by weight) of a carbonaceous material initially to a siliceous material, and carrying out the reaction at about 1,500° C. to about 1,900° C., while in the recrystallization process a carbonaceous material is added in a small amount (generally 10% by weight or below), and the heat treatment temperature is required to be about 2,000° C. or over. The silicon carbide produced by the reaction of the large amount of the added carbon consequently strengths the bond between the particles, so that the strength of the reaction-sintered silicon carbide is increased.

Since the present diffusion tube uses reaction-sintered silicon carbide as the base material, it will not disadvantageously deform or devitrify even at a high temperature. Further, it is excellent in strength and will not break due to the thermal stress caused by a difference in the in thermal expansion coefficient between the silicon carbide layer and the tube base. In this case, if the Si content in the reaction-sintered silicon carbide is too high, the difference in the thermal expansion coefficient between the reaction-sintered silicon carbide base and the silicon carbide layer may become high, and the diffusion tube may break easily. From this viewpoint, Si content in the base material is preferably 25 vol. % or below, more preferably 20 vol. %. or below. The lower limit of Si content may preferably be 8 vol. %. In other words, it is required that the density of the base material is 3.0 g/cm$^3$ or over, preferably 3.0 to 3.10 g/cm$^3$, most preferably 3.03 to 3.10 g/cm$^3$.

The size of the diffusion tube base is not limited, although generally the inner diameter is in the range of about 80 mm to about 250 mm, the thickness is in the range of about 4 mm to about 8 mm, and the length is in the range of about 1200 mm to about 3500 mm.

To produce the diffusion tube having the above-mentioned silicon carbide film deposited, a reaction-sintered silicon carbide diffusion tube base whose iron concentration has been controlled to 20 ppm or below and whose density has been controlled to 3.0 g/cm$^3$ or over is prepared, and a silicon carbide film having an iron concentration of 5 ppm or below is deposited on the inner surface of the tube base. In this case, it is desirable to form the silicon carbide film after impurities on the tube base surface are removed thoroughly by immersing the tube base in an acid such as conc. hydrochloric acid solution (e.g. HCl: H$_2$O = 1:1) or the like for several hours.

Although any process which can form a high-purity silicon carbide film having an iron concentration of 5 ppm or below can be used, a vapor phase synthesis process, which is commonly called CVD (chemical vapor deposition) process, for depositing a silicon carbide film on the inner surface of the tube base is preferably employed. In the chemical vapor deposition process, a raw material gas comprising CH$_3$SiCl$_3$, CH$_3$SiHCl$_2$, (CH$_3$)$_2$SiCl$_2$, SiCl$_4$+CH$_4$, SiCl$_4$+C$_3$H$_8$, or the like is passed over the inner surface of the reaction-sintered silicon carbide diffusion tube base loaded in a CVD furnace thereby depositing SiC on the inner surface of the tube base. The raw material gas is not limited to the above gases, and any gases for forming a SiC film that are generally used in the CVD process can be used. The pressure may be normal pressure or reduced pressure, and generally a pressure of 10 to 200 mm Hg can be employed. The temperature is preferably 1,000° to 1,400° C. If the temperature is below 1,000° C., the deposited film may become amorphous and unstable. On the other hand, if the temperature is over 1,400° C., the Si of the base material may be melted and come outside.

Figure 2:
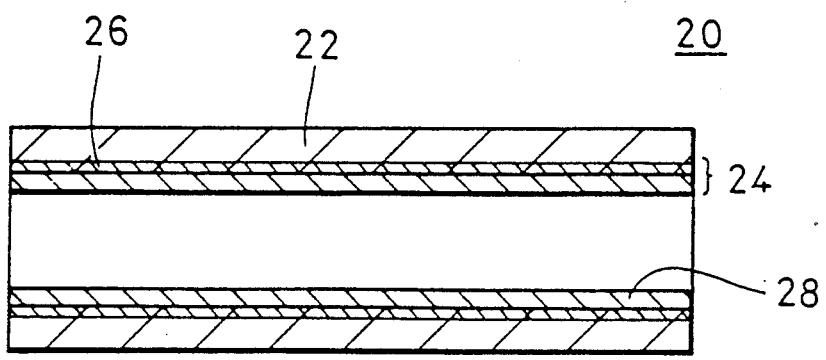
FIG. 2 is a sectional view showing another embodiment of a diffusion tube according to the present invention.

FIG. 2 shows another embodiment of a diffusion tube 20 according to the present invention. The diffusion tube 20 comprises a diffusion tube base 22 made of reaction-sintered silicon carbide, and a silicon carbide layer 24 consisting of a Si-depleted layer 26 formed in the inner wall of the tube base 22 and a high-purity silicon carbide film 28 deposited on the Si-depleted layer 26. By forming the Si-depleted layer, the thickness of the silicon carbide film to be deposited can be decreased, thereby reducing the production cost.

In this diffusion tube 20, the silicon carbide layer 24 consisting of the Si-depleted layer 26 and the deposited silicon carbide film 28 has a thickness of more than 500 μm. The upper limit of the thickness of the silicon carbide layer is 2000 μm. In this case, the thickness of the Si-depleted layer 26 preferably is 0.4 to 0.7 mm. If the thickness of the Si-depleted layer is below 0.4 mm, it is required that deposition of a silicon carbide film is made excessively to obtain a prescribed thickness of the silicon carbide layer, and therefore the merit that decreases the production cost may not be obtained. On the other hand, if the thickness of the Si-depleted layer is over 0.7 mm, pores are liable to remain in the inner surface of the tube base, and these pores render the strength low, causing breakage, and the pore themselves may act as a gas generating source, that is, an impurity generating source. The thickness of the silicon carbide film may preferably be more than 500 μm.

The Si-depleted layer can be formed by a Si removing treatment to the inner wall of the reaction-sintered silicon carbide diffusion tube base to allow the inner wall thereof to be free of Si or reveal only SiC.

As a process of removing Si from the inner wall of the tube base, a solution treatment or hydrochloric acid gas treatment is preferably employed. The solution treatment is carried out by immersing the tube base in conc. hydrofluoric acid, conc. nitric acid or a mixture thereof, if necessary with dilution of water, preferably at 10° to 30° C., typically room temperature. The preferred acid is a mixture of conc. hydrofluoric acid and conc. nitric acid. The concentration of the acid may preferably be more than 40% by weight, more preferably more than 50% by weight in the acid solution. The gas treatment is carried out by passing hydrochloric acid gas into the tube base heated at about 1000° C. to about 1200° C. for 2 to 8 hours. After the treatment, it is desirable to wash well the inner wall of the tube base with water not to allow the acid to remain. Thereafter, the film deposition by CVD process is carried out. In this case, pores in the Si-depleted or Si-free layer which are formed in the Si removing treatment can be filled with the silicon carbide deposit at the time when the silicon carbide film is formed on the Si-depleted or Si-free layer by CVD process.

The reaction-sintered silicon carbide diffusion tube base may preferably have an iron concentration of 20 ppm or below and a density of 3.0 g/cm$^3$ or over. The silicon carbide film may preferably have an iron concentration of 5 ppm or below.

As described above, the present silicon carbide type diffusion tube does not have disadvantages such as deformation and devitrification even at a high temperature, is excellent in strength, can be used for a long period of time under high-temperature conditions, and would not cause a silicon wafer to have defects due to the presence of impurities. Therefore, when a semiconductor is heat-treated by using the present diffusion tube, the yield of the semiconductor in its production can be improved.

. In this case, as described above, the prior art production of a silicon carbide diffusion tube uses a recrystallization process and the recrystallized silicon carbide obtained in this method is low in strength. If this silicon carbide is used to produce a diffusion tube and a thick silicon carbide layer of more than 500 μm is formed on the inner surface thereof, the layer is liable to break when it is used. In contrast, the present diffusion tube is high in strength because reaction-sintered silicon carbide is used as the base material, and even if a thick silicon carbide layer is formed on the inner surface of the reaction tube, it hardly breaks, allowing the formation of a thick silicon carbide layer of more than 500 μm.

The present invention will now be specifically described with reference to Examples and Comparative Examples, but the present invention is not limited to the Examples.

EXAMPLE 1

Two constricted diffusion tubes having an outer diameter of 184 mm, an inner diameter of 170 mm, and a length of 2,300 mm were prepared with the degree of purification of the raw materials and the molding pressure varied.

The impurity analysis was made using two dummy tube samples, and the iron concentrations thereof were found to be 8 ppm and 47 ppm, respectively. The densities thereof were 3.01 g/cm³ and 2.94 g/cm³, respectively.

Then the diffusion tubes and the dummy samples were immersed in a hydrochloric acid solution of $HCl:H_2O=1:1$ (weight ratio) for 5 hours to remove impurities on the surface, and thereafter were washed well with water and dried to set in a CVD furnace. The pressure in the furnace was reduced to 120 Torr, and trichloromethylsilane and hydrogen gas were passed at rates of 1 l/min and 10 l/min respectively over the inner surface of each of the diffusion tubes and the dummy samples whose temperature was raised and kept at 1,300° C. to deposit a silicon carbide film having a thickness of 200 μm on the inner surface thereof. The dummy samples were analyzed and it was found that the films contained iron in amounts of 5 ppm and 12 ppm, respectively.

Then the two diffusion tubes were loaded in a diffusion furnace, and a silicon wafer (CZ-P type <100>) was inserted into each of the diffusion tubes. The silicon wafers were heat-treated in dry oxygen at 1,200° C. for 100 min. The wafers were subjected to wafer Sirtl-etching, and the density of defects was examined under a microscope. The results are shown in Table 1.

For comparison, the same test was carried out using a quartz diffusion tube. The results are also shown in Table 1.

of 184 mm, an inner diameter of 170 mm, and a length of 2,300 mm were prepared, and the inner surfaces thereof were treated with an aqueous solution of $HF:HNO_3$: water=1:1:1 (weight ratio) for 1, 6 and 15 hours, respectively, thereby removing Si on the inner surface. Dummy samples were treated simultaneously therewith and were examined, and the results were such that the eroded layers (Si-depleted layers) had thicknesses of 0.15 mm, 0.5 mm and 0.8 mm respectively. Then, the diffusion tubes were washed well with water and dried to load in a CVD furnace. The pressure in the furnace was reduced to 30 Torr, and trichloromethylsilane and hydrogen gas were passed at rates of 1 l/min and 10 l/min respectively over the inner surface of each of the diffusion tubes and the dummy samples whose temperature was kept at 1,300° C. by resistance heating to deposit a silicon carbide film on the inner surface of the Si-depleted layer. At that time, the depositing time was varied to vary the thickness of the silicon carbide layer on the inner surfaces of the three diffusion tubes. The thicknesses of the silicon carbide layers (Si-depleted layer+SiC film deposited thereon) of the dummy samples treated simultaneously therewith were measured and found to be 0.35 mm, 1.2 mm, and 2.1 mm, respectively. These results were in conformity with the results that were obtained by the measurement of a diffusion tube destruction test after the below-mentioned lifetime test of wafers. The purity of the silicon carbide film of the dummy sample was determined and it contained Fe in an amount of 4 ppm.

Then, the three diffusion tubes were loaded in a diffusion furnace, and a silicon wafer (CZ-P type <111>)

TABLE 1

| | Base material | Iron concentration in base material (ppm) | Density of base material (g/cm³) | Thickness of SiC film (mm) | Iron concentration in SiC film (ppm) | Density of defects (Pieces/cm²) |
|---|---|---|---|---|---|---|
| No. 1 | reaction-sintered silicon carbide | 8 | 3.01 | 0.2 | 5 | 18 |
| No. 2 | reaction-sintered silicon carbide | 47 | 2.94 | 0.2 | 12 | 43 |
| No. 3 | quartz | — | — | — | — | 26 |

To investigate the influence of a long-period operation, No. 1 and No. 2 diffusion tubes were loaded in a diffusion furnace, and a heat cycle consisting of 800° C. (kept for 2 hours) and 1,200° C. (kept for 2 hours) was repeated to determine the life. No change in No. 1 diffusion tube was observed after 100 cycles, and on the other hand the No. 2 diffusion tube broke at 82 cycles.

EXAMPLE 2

Three constricted diffusion tubes of reaction-sintered silicon carbide type material having an outer diameter was inserted into each diffusion tube. The wafers were heat-treated in dry oxygen at 1,100° C. for 4 min. To examine the degree of the contamination of each silicon wafer, the lifetime of the wafers was measured. The results are shown in Table 2.

For comparison, a quartz diffusion tube and a silicon carbide type diffusion tube having no silicon carbide layer on the inner surface thereof were subjected to the same test, and the results are also shown in Table 2.

It should be noted that the lower the contamination is, the longer the lifetime of the wafer is.

TABLE 2

| | Base material | Thickness of Si-depleted layer (mm) | Thickness of SiC layer (mm) | Iron concentration in SiC film | Lifetime of wafer (μ sec) |
|---|---|---|---|---|---|
| No. 4 | reaction-sintered silicon carbide | 0.5 | 1.1 | 4 | 112 |
| No. 5 | reaction-sintered silicon carbide | 0.15 | 0.35 | 4 | 112 |
| No. 6 | reaction-sintered silicon | 0.8 | 2.1 | 4 | 106 |

TABLE 2-continued

|  | Base material | Thickness of Si-depleted layer (mm) | Thickness of SiC layer (mm) | Iron concentration in SiC film | Lifetime of wafer ($\mu$ sec) |
|---|---|---|---|---|---|
| No. 7 | carbide reaction-sintered silicon carbide | 0 | — | — | 89 |
| No. 8 | quartz | — | — | — | 104 |

To examine the influence of a long-period operation, No. 4 to No. 6 diffusion tubes were loaded in a diffusion furnace, and a heat cycle consisting of 800° C. (kept for 2 hours) and 1,200° C. (kept for 4 hours) was repeated, and the lifetime was measured in the same manner as before. The results are shown in table 3. No. 6 test tube broke at 27 cycles.

TABLE 3

|  | Thickness of SiC layer (mm) | Lifetime of wafer ($\mu$ sec) |
|---|---|---|
| No. 4 | 1.1 | 114 |
| No. 5 | 0.35 | 87 |
| No. 6 | 2.1 | — |

What is claimed is:

1. A silicon carbide type diffusion tube comprising a diffusion tube base made of reaction-sintered silicon carbide having an iron concentration of 20 ppm or below and a density of 3.0 g/cm$^3$ or over, and a silicon carbide layer comprising a high-purity silicon carbide film having an iron concentration of 5 ppm or below and a thickness of 500 to 2000 $\mu$m deposited on the inner surface of the tube base.

2. The diffusion tube of claim 1 wherein the high-purity silicon carbide film has an iron concentration of 1 ppm or below.

3. The diffusion tube of claim 1 wherein the high-purity silicon carbide film is formed by chemical vapor deposition process.

4. The diffusion tube of claim 1 wherein the tube base has an iron concentration of 10 ppm or below.

5. The diffusion tube of claim 1 wherein the tube base has an iron concentration of 5 ppm or below.

6. The diffusion tube of claim 1 wherein the tube base has a density of 3.03 to 3.10 g/cm$^3$.

7. A silicon carbide type diffusion tube comprising a diffusion tube base made of reaction-sintered silicon carbide having an iron concentration of 20 ppm or below and a density of 3.0 g/cm$^3$ or over, and a silicon carbide layer comprising a Si-depleted layer formed on the inner wall of the reaction-sintered silicon carbide tube base, the Si-depleted layer having a thickness of 0.4 to 0.7 mm, and a high-purity silicon carbide film deposited on the Si-depleted layer having an iron concentration of 5 ppm or below, said silicon carbide layer having a thickness of more than 500 $\mu$m.

8. The diffusion tube of claim 7 wherein the silicon carbide film has a thickness of from more than 500 $\mu$m to 2000 $\mu$m.

9. A process for manufacturing a silicon carbide type diffusion tube, which comprises:
forming a diffusion tube base with reaction-sintered silicon carbide so that the diffusion tube base has an iron concentration of 20 ppm or below and a density of 3.0 g/cm$^3$ or over,
subjecting the inner wall of the tube base to Si removing treatment to form an Si-depleted layer having a thickness of 0.4 to 0.7 mm, and
forming a high-purity silicon carbide film having an iron concentration of 5 ppm or below by chemical vapor deposition on said Si-depleted layer so that a silicon carbide layer comprising a Si-depleted layer and said silicon carbide film has a thickness of more than 500 $\mu$m.

10. The process of claim 9 wherein the Si removing treatment is carried out by immersing the tube base in an acid solution containing hydrofluoric acid and nitric acid.

11. The process of claim 9 wherein the Si removing treatment is carried out by passing hydrochloric acid gas through the tube base at a high temperature.

12. The diffusion tube of claim 7, wherein the high-purity silicon carbide film is deposited on the Si-depleted layer by chemical vapor deposition.

* * * * *